United States Patent
Munroe et al.

(10) Patent No.: US 10,218,144 B2
(45) Date of Patent: Feb. 26, 2019

(54) SOLID STATE LASER SYSTEM

(71) Applicant: Voxtel, Inc., Beaverton, OR (US)

(72) Inventors: Michael Munroe, Eugene, OR (US); Edward Whitney Elliott, III, Eugene, OR (US); George Williams, Portland, OR (US)

(73) Assignee: LadarSystems, Beaverton, OR (US)

( * ) Notice: Subject to any disclaimer, the term of this patent is extended or adjusted under 35 U.S.C. 154(b) by 0 days.

(21) Appl. No.: 15/927,053

(22) Filed: Mar. 20, 2018

(65) Prior Publication Data

US 2018/0219351 A1 Aug. 2, 2018

Related U.S. Application Data

(63) Continuation-in-part of application No. 15/190,102, filed on Jun. 22, 2016, now Pat. No. 9,923,331, which is a continuation-in-part of application No. 14/679,884, filed on Apr. 6, 2015, now Pat. No. 9,397,469.

(51) Int. Cl.
| | |
|---|---|
| *H01S 3/11* | (2006.01) |
| *H01S 3/094* | (2006.01) |
| *H01S 5/02* | (2006.01) |
| *H01S 5/024* | (2006.01) |
| *H01S 3/106* | (2006.01) |

(Continued)

(52) U.S. Cl.
CPC ...... *H01S 3/094076* (2013.01); *H01S 3/0405* (2013.01); *H01S 3/0612* (2013.01); *H01S 3/1061* (2013.01); *H01S 5/0216* (2013.01); *H01S 5/02476* (2013.01); *H01S 3/025* (2013.01); *H01S 3/042* (2013.01); *H01S 3/0604* (2013.01); *H01S 3/09415* (2013.01); *H01S 3/094038* (2013.01); *H01S 3/094053* (2013.01); *H01S 3/1022* (2013.01); *H01S 3/113* (2013.01); *H01S 3/1312* (2013.01); *H01S 3/1608* (2013.01); *H01S 3/1618* (2013.01); *H01S 3/1666* (2013.01); *H01S 5/02248* (2013.01)

(58) Field of Classification Search
CPC ........ H01S 3/11; H01S 3/1115; H01S 3/1118; H01S 3/1124; H01S 3/113; H01S 3/115; H01S 3/117; H01S 3/121; H01S 3/025; H01S 3/042; H01S 3/0405; H01S 3/094038; H01S 3/094076; H01S 3/1608; H01S 3/1618; H01S 3/1666; H01S 3/1312; H01S 3/0612

See application file for complete search history.

(56) References Cited

U.S. PATENT DOCUMENTS

| | | | |
|---|---|---|---|
| 2002/0085608 A1* | 7/2002 | Kopf | H01S 3/09415 372/75 |
| 2002/0105997 A1* | 8/2002 | Zhang | H01S 3/0941 372/70 |

(Continued)

*Primary Examiner* — Kinam Park

(57) ABSTRACT

A method of bonding an RE:XAB gain medium to a heat spreader includes using a bonding solution of sodium silicate with concentration of sodium silicate is Na2O at 21.2% and SiO2 at 53% with PH>=11 mixed with nano-pure water in a 1:1 ration. Applying the bonding solution onto either a surface of the RE:XAB or a surface of the heat spreader, aligning the RE:XAB and the heat spreader, applying pressure to draw the surfaces of the RE:XAB gain medium and the heat spreader together thereby uniformly spreading the bonding solution; and then curing the bonding solution.

16 Claims, 12 Drawing Sheets

(51) Int. Cl.
*H01S 3/04* (2006.01)
*H01S 3/0941* (2006.01)
*H01S 3/102* (2006.01)
*H01S 3/113* (2006.01)
*H01S 3/131* (2006.01)
*H01S 3/16* (2006.01)
*H01S 5/022* (2006.01)
*H01S 3/02* (2006.01)
*H01S 3/042* (2006.01)
*H01S 3/06* (2006.01)

(56) References Cited

U.S. PATENT DOCUMENTS

2003/0138021 A1* 7/2003 Hodgson ................ H01S 3/042
 372/75
2007/0238219 A1* 10/2007 Bennett ................... H01S 3/042
 438/106

* cited by examiner

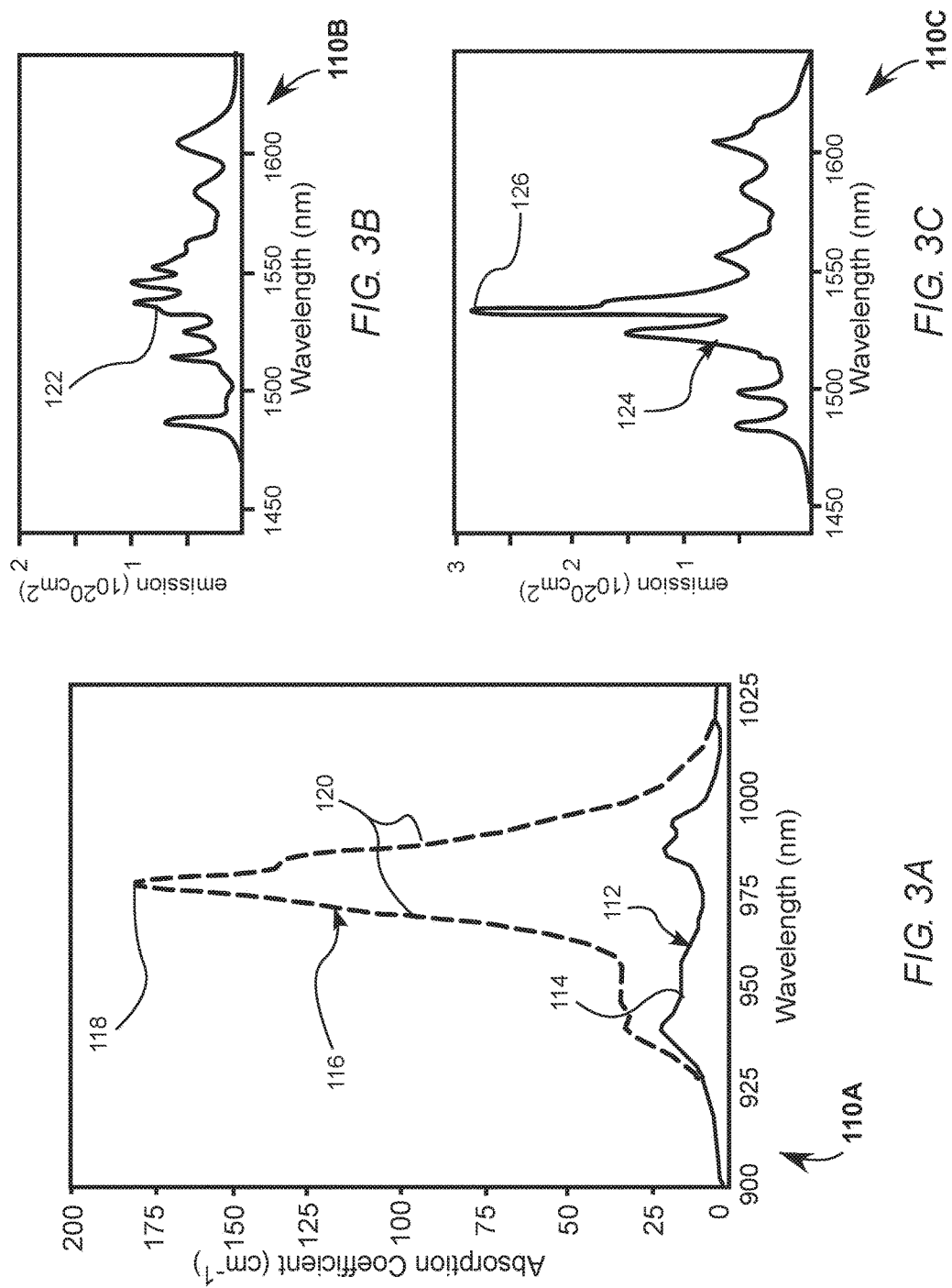

SOLID STATE LASER SYSTEM

RELATED APPLICATIONS

This application is a continuation-in-part of patent application Ser. No. 14/679,884, filed on Apr. 6, 2015 which is a continuation-in-part of patent application Ser. No. 14/679,884, filed on Apr. 6, 2015, now issued as U.S. Pat. No. 9,397,469.

TECHNICAL FIELD

The present disclosure relates in general to solid state laser systems. The disclosure relates in particular to solid state laser systems with a heat spreader.

BACKGROUND INFORMATION

Lasers are used in a variety of applications. Lasers are used in medical, manufacturing, military, and consumer applications. One laser type, solid-state lasers, are based on crystalline or glass rods doped with ions. The doped rods are within in a resonator cavity and pumped to excited states which decay emitting laser light.

SUMMARY OF THE DISCLOSURE

The present disclosure is directed to a laser system, methods of manufacturing the same, and methods of operating a laser system. In one embodiment, a method of operating a q-switch RE,XAB laser includes: providing a pump bias current to a pump source, the pump source directed to an RE:XAB gain medium, the RE:XAB gain medium within a resonator cavity, where X is selected from Ca, Lu, Y, Yb, Nd, Sm, Eu, Gd, Ga, Tb, Dy, Ho, Er, and where RE is selected from Lu, Y, Nd, Sm, Eu, Gd, Tb, Dy, Ho, Er, Pr, Tm, Cr, Ho, including the lanthanide ions, with a bias current level below a lasing threshold of the RE:XAB gain medium; providing a pump pulse to the gain medium, the pump pulse of the lasing threshold of the RE:XAB gain medium, the pump pulse causing the RE:XAB gain medium to emit a laser pulse; and reducing the pump bias current to at least below the gain medium lasing threshold, the combination of the pump bias, the pump pulse, and the pump reduction having a current profile.

One method of bonding the RE:XAB gain medium to the heat spreader includes using a bonding solution of sodium silicate with concentration of sodium silicate is Na2O at 21.2% and SiO2 at 53% with PH>=11 mixed with nano-pure water in a 1:1 ration. Applying the bonding solution onto either a surface of the RE:XAB or a surface of the heat spreader, aligning the RE:XAB and the heat spreader, applying pressure to draw the surfaces of the RE:XAB gain medium and the heat spreader together thereby uniformly spreading the bonding solution; and then curing the bonding solution.

BRIEF DESCRIPTION OF THE DRAWINGS

The accompanying drawings, which are incorporated in and constitute a part of the specification, illustrate preferred methods and embodiments of the present disclosure. The drawings together with the general description given above and the detailed description of preferred methods and embodiments given below, serve to explain principles of the present disclosure.

FIG. 3A is a graph of the absorption coefficient spectra of the RE:XAB wherein RE is Er, Yb and X is Y for the $\pi$-polarization and $\sigma$-polarization.

FIG. 3B is a graph of the emission spectra of the $\pi$-polarization state of the Er,Yb:YAB gain medium.

FIG. 3C is a graph of the emission spectra of the $\sigma$-polarization of the Er,Yb:YAB gain medium.

DETAILED DESCRIPTION OF EMBODIMENTS

Figure 1:
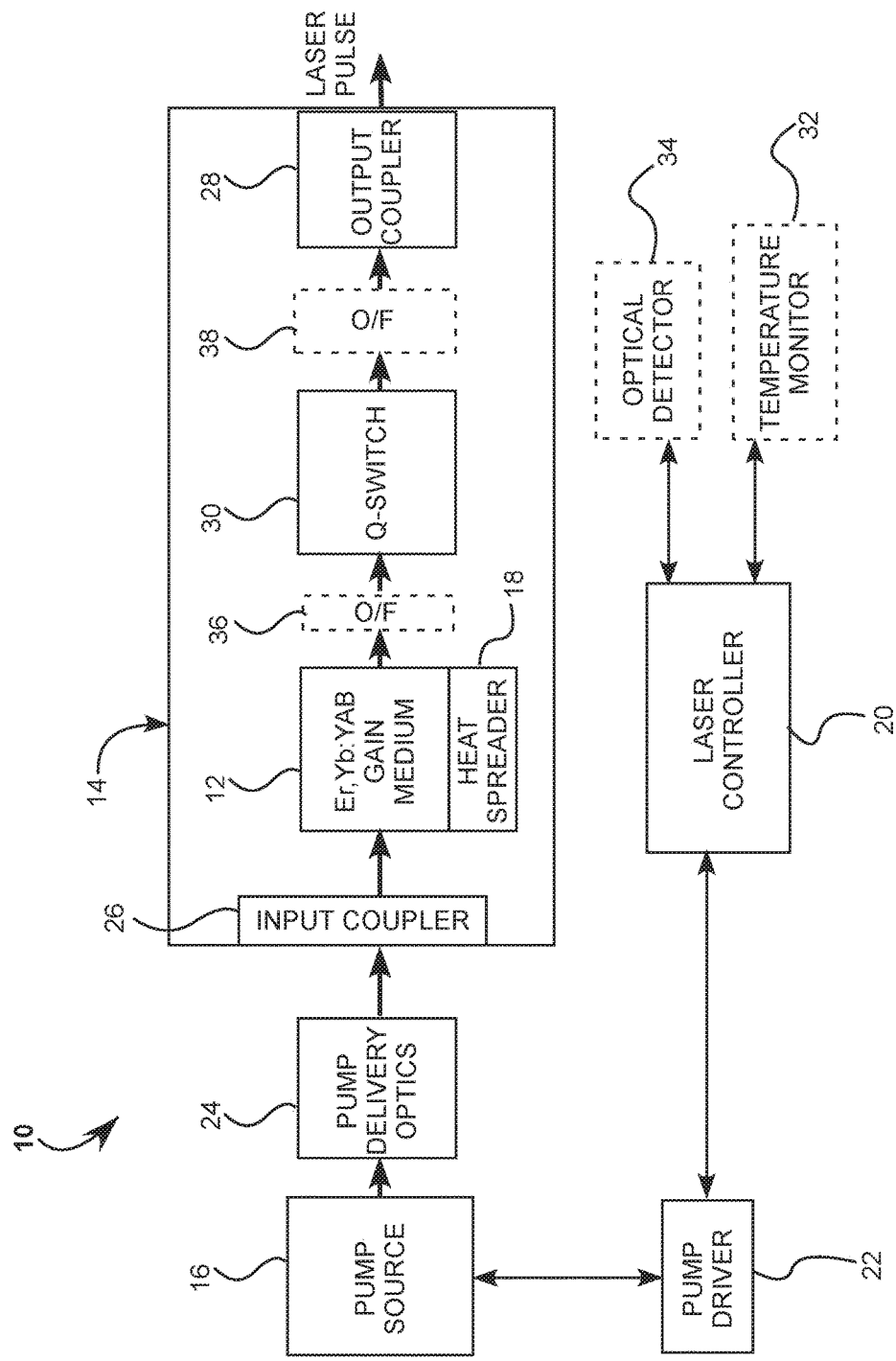
FIG. 1 is a block diagram of a laser system with a RE:XAB gain medium, the laser system within a resonator cavity, a pumping source, the pumping source directed towards the gain medium, a heat spreader, the heat spreader in thermal communication with the gain medium, and a laser controller, the laser controller operating the laser system.

Referring now to the drawings, wherein like components are designated by like reference numerals. Methods and various embodiments of the present invention are described further hereinbelow.

FIG. 1 is a block diagram illustrating a preferred embodiment 10 of a laser system. Laser system 10 includes a doped RE:XAB gain medium 12, gain medium 12 within a resonator cavity 14. Gain medium 12 is in thermal communication with a heat spreader 18. A pumping source 16 directs output towards gain medium 12. A laser controller 20 operates the laser system, by controlling a pump driver 21, the pump driver delivering current to pump source 16.

The RE:XAB gain medium is a borate crystal wherein (X) is selected from Y, Ca, Lu, Yb, Nd, Sm, Eu, Gd, Ga, Tb, Dy, Ho, or Er, (A) is aluminum, and (B) is borate doped with rare earth elements. (RE) can be selected from Lu, Y, Yb, Nd, Sm, Eu, Gd, Tb, Dy, Ho, Er, Pr, Tm, Cr, Ho, including the lanthanide ions, or combinations thereof.

The gain medium is expressed through the present disclosure as RE:XAB. In some embodiments the XAB crystal is codoped and RE is understood to mean a plurality of dopants. The RE:XAB is manufactured using high temperature dipping seed solution. The percentage of RE dopants depends on the concentrations of the RE dopants in the high temperature dipping seeded solution growth (DSSG) of the crystal using the flux method. In growth, RE ions replace sites within the XAB crystal. One nonlimiting example of a suitable dopant concentration for the present embodiment is Er at about 3 at. %. Er doping concentrations can range from about 1% to about 25%. Doping ions, such as chromium (Cr), Iron (Fe) and gallium (Ga) can be incorporated within the XAB crystal during growth, replacing Al sites.

The gain medium crystal can be cut on both an a-cut or a c-cut crystallographic axes. The c-cut RE:XAB gain medium has a smaller absorption cross-section and absorbs more efficiently than the a-cut RE:XAB gain medium. When cut and polished the Re:XAB gain medium can be shaped with a cross-section that is curved edges, with straight edges, such as a polygon, or combinations thereof. Further the RE:XAB gain medium cross-section can change to any desired shape along its length with abrupt or smooth transitions. In one embodiment the RE:XAB gain medium cross-section is circular with diameter about the size of the expected pumping source illumination area.

RE:XAB gain medium 12 has absorption bands that are dependent on the dopants. In some embodiment absorption bands are in the near-infrared (NIR) and stimulated emission bands at longer wavelengths bands in the near-infrared. The gain medium can be resonantly pumped at wavelength within about 200 nanometers of the laser system emission wavelength. Through the present disclosure the wavelengths used to excite the gain medium are generally referred to as pumping radiation. The wavelengths emitted from the gain medium after excited state radiative decay are generally referred to as NIR long wavelength bands and called lasing emission, stimulated emission or laser pulse when the radiative decay is caused by stimulated emission.

Nonlimiting design factors for the RE:XAB gain medium include the crystal shape, diameter, thickness, RE doping concentration, RE doping concentration, Al replacement site doping, crystallographic axis cut, angular orientation with respect to pump polarization, surface coating and surface shape.

In some embodiments the RE:XAB is codoped and RE is a plurality of dopants. For instance, RE codopants can be Yb and Er. When optically pumped the Yb ions absorb NIR short wavelength they efficiently transfer the absorbed energy to an excited state of the Er ions. Rapid non-radiative decay of the Yb excited state populates the upper level of the Er laser transition. The Er laser transition can decay to its ground state by radiative decay by stimulated emission.

Pumping source 16 outputs optical energy directed towards gain medium 12. Pumping source 16 can be a lamp, led, laser diode, laser system, or other optical radiation source. Depending on the pumping source type, the optical output of pump source 16 can vary with respect to wavelength, optical bandwidth, output angle, spatial intensity profile, angular intensity profile, polarization, or pump profile and combinations thereof. Further a plurality of the pump sources can be employed. The pumping source wavelength and optical bandwidth can be altered based on the pumping source type and can be modified by, for instance, dielectric coating, Bragg grating, or other such optical filter. Pump source 16 can be oriented to provide polarized, randomly polarized or partially polarized optical radiation. When the light is polarized or partially polarized, the polarization azimuth can be fixed at any angle or otherwise elliptically rotate.

Laser controller 20 operates and controls a pump driver 22, the pump driver delivers current to pump source 16. Pump source 16 can be driven with constant or modulated current profiles. A plurality of pump drivers can be employed for each of the pumping sources, when more than one pumping source is provided the current profile can be digital, analog, or combinations thereof. Specific modulation methods are discussed in greater detail further hereinbelow.

The pump sources can be polarized, with multiple sources having different polarization. Sources can be delivered using fiber optics.

A pump delivery optic 24 receives optical output from pump source 16 and directs the pumping radiation towards Re:XAB gain medium 12. The pump directs light emitted by the pump source 16 such that gain medium 12 is illuminated in an area about corresponding with the desired stimulated emission beam size. Pump delivery optics 24 can include refractive, reflective, diffractive, waveguides, spatial filters, optical filters, and combinations thereof.

In addition to directing the pumping radiation to the gain medium, the pump delivery optics can include spatial filtering, fiber optic, and homogenization optics in order to combine sources or to provide the desired spatial illumination profile on the gain medium. Nonlimiting factors in designing the pumping optics include the number of the pumping sources, desired wavelength, optical bandwidth, entrance angle, spatial intensity profile, angular intensity profile, polarization, and combinations thereof. The pump radiation directed by pump delivery optics 24 enter resonator 14, and are directed to the RE:XAB gain medium within the resonator.

Resonator 14 is defined by a first resonator surface 26 on an input coupler and a second resonator surface 28 on an output coupler. The input coupler transmits the pump radiation, allowing the pump radiation to enter gain medium 12. The input coupler at least partially reflects laser radiation. Output coupler 28 at least partially reflects lasing radiation. In general, the output coupler is the surface that allows laser pulses to exit the resonator, although in some embodiment the input coupler allows pulses to exit and is therefore both the input coupler and the output coupler. In practice, the input and output coupler surfaces can be defined on any surfaces of the optical-elements within the laser system, including the gain medium, so long as multiple stimulated emission resonates through the gain medium. Resonator 14 can incorporate end-pump, side-pump, ring-oscillator and other such resonator designs. Further a plurality of the input coupler and the output coupler surfaces can be employed.

Within the resonator is a q-switch 30. Q-switch 30 can be an active or passive device. Passive q-switching techniques include saturable absorber and thin-film absorbers including bulk nonlinear saturable absorbers, semiconductor saturable absorber mirrors (SESAMs), saturable absorber output coupler and related devices. Active q-switching include electro-optic, acousto-optic, mechanically rotating or switching, microelectromechanical systems, and hybrid optical driven passive q-switching. When the q-switch is active, the laser controller operates the q-switch directly or through a driver. Nonlimiting factors in designing the q-switch, although such considerations are coupled to the laser system design as a whole, include the required numerical aperture, maximum pulse frequency modulation, pulse duration, pulse width, recovery time, peak pulse power, modulation depth, damage threshold, and absorption coefficient.

RE:XAB Gain medium 12 is in thermal communication with a heat spreader 18. Heat spreader 18 allows heat dissipation from RE:XAB gain medium 12 when the laser system is operated at higher powers or otherwise allow temperature control of the RE:XAB gain medium. Heat spreader 18 can be part of a mechanical mount in thermal contact with the gain medium on the crystal surfaces, perimeter, or both. The heat spreader can be a thermally conductive epoxy, solder, or other curable substance that can act as both an adhesive and allow thermal transport. Alternatively the heat spreader can be an optically transparent window, at one of the optically transparent window surfaces in contact with one of the RE:XAB gain medium surfaces. The optically transparent window may be polarized. The optically transparent window is preferable refractive index matched to the RE:XAB gain medium. The optically transparent window is chosen from materials with good thermal conduction characteristics, good hardness, and good ability to withstand thermal shock. Such materials include sapphire, diamond, synthetic diamond, or ceramic.

Thermal communication between the heat spreader and the RE:XAB gain medium can be increased with bonding solution, thermal conductive epoxy, paste, solder, wettable metals such as indium, and techniques such as plating, conformal contact, optical contact, CVD deposition, or diffusion bonding when appropriate. Conformal contact refers to approximate surface matching and can include adhesives. Optical contact refers to conformal surface shaping wherein each surface is optically quality, typically surface conformance better than about 1-2 nanometers, and contaminant free, such that intermolecular forces hold the surfaces together. Diffusion bonding is similar to optical contact except in addition to optical contact, heating and pressure processes reaching up to 60%-80% of the melting temperature to allow atomic diffusion of elements between the parts thereby forming a bond.

In one preferred bonding example, the heat spreader is an optically clear material such as sapphire which is bonded with the RE:XAB gain medium using a custom Hydroxide-Catalysis bonding technique and solution. Using this technique bonding surfaces are preferably in close proximity and their surface irregularity of less than $\lambda/10$ peak-to-valley is preferred to maximize bond strength. In this bonding process, the bonding solution is prepared, surfaces cleaned, then the bonding solution is applied.

First the bonding solution is prepared by pouring 2 ml of Sodium Silicate [(NaOH)x(Na2SiO3)y.SiO2] at a concentration of Na2O 21.2%, SiO2 53.0%, pH>=11 into a 15 ml tube. 2 ml of nano-pure water is added to create a 1:1 volumetric ratio. Immediately prior to use, the solution should be sonicated, for example at 40 khz, 70 W, for 5 minutes. Next the solution the surfaces of the heat spreader and the RE:XAB are cleaned using nano-pure water. Each surface is scrubbed with an optical grade tissue or pad with cerium oxide paste, then rinsed with nano-pure water. The surfaces are then either immersed, or cleaned with an optical grade tissue immersed, in sodium bicarbonate solution or paste to neutralized. The surfaces are once again cleaned and rinsed with nano-pure water to remove the sodium carbonate. The surfaces are then rinsed with optics grade methanol and dried with lens tissue. These cleaning steps can be repeated until the surfaces are clean and free of particles. The surfaces are then bonded. The RE:XAB gain medium and the heat spreader are aligned under microscope. The bonding solution is pipetted onto either the RE:XAB or the heat spreader, avoiding contamination of other surfaces. The alternate is then aligned on top. A small amount of pressure forces the two surfaces together spreading the bonding solution evenly. For small optics, millimeter range, a small micro spatula provides sufficient force. The surfaces are then cured for about 24 hours at room temperature. This process can be repeated for as many surfaces require bonding.

Aforementioned bonding process can be applied to individual components, or be performed prior to dicing of the RE:XAB gain medium. In general, an excess the bonding solution provides better contact for individual crystals.

The heat spreader can be in thermal communication with a heat sink. The heat sink or the heat spreader can be thermally controlled with passive cooling, active cooling, or combinations thereof. Passive cooling can include fins, rods, metal foam and other such structured surfaces. Such features can be placed on or within the heat spreader or a conductive mount, baseplate, or any heatsink which the heat spreader is also in thermal communication. Active cooling can include fans, circulating fluids or thermoelectric coolers.

Optionally, a temperature monitor 32 can be placed on gain medium 12, heat spreader 18, pumping source 16, on any other element within the laser system or in thermal communication with an element within laser system and combination thereof. Temperature monitor 32 can be a thermistor and provide temperature feedback to laser controller 20. Laser controller 20 can then control operation of any active cooling devices provided or otherwise alter operation of the laser system based on previous characterization or concurrently measured laser performance. For instance, concurrent measured performance can be done by integrating an optical detector 34.

Optical detector 34 can measure optical radiation from either the pump source, scattered laser radiation, or direct laser radiation and combinations thereof. Optical detector 34 can be a PIN photodiode, avalanche photodiode, piezo based detector, or any other detector capable of fast energy pulses detection. One semiconductor material capable of detecting NIR is InGaAs. Either a single or plurality of optical detectors can be implemented for detecting optical radiation from the laser system. Detected laser radiation can provide feedback to laser controller 20. Laser controller 20 can then control operation of the pump driver, or any other controllable device provided, based on the optical feedback.

In addition to the optical components specifically referenced, a variety of optical components can be implemented within the laser system, placed at any position between the pumping source and the laser output. By way of example, an optical component 36 can be placed between RE:XAB gain medium 12 and Q-switch 30 or an optical component 38 can be placed between q-switch 30 and output coupler 28. The optional optical components can be a single or plurality of refractive lenses, reflective mirrors, diffractive surfaces, spatial filters, spectral filters, polarizers, attenuators and combinations thereof. Introduction of such elements allows modification of the laser emission, nonlimiting examples of which include resonator characteristics, beam shape, beam size, allowed modes, mode mixing, divergence, wavelength, spectral bandwidth, and polarization.

Figure 2A:
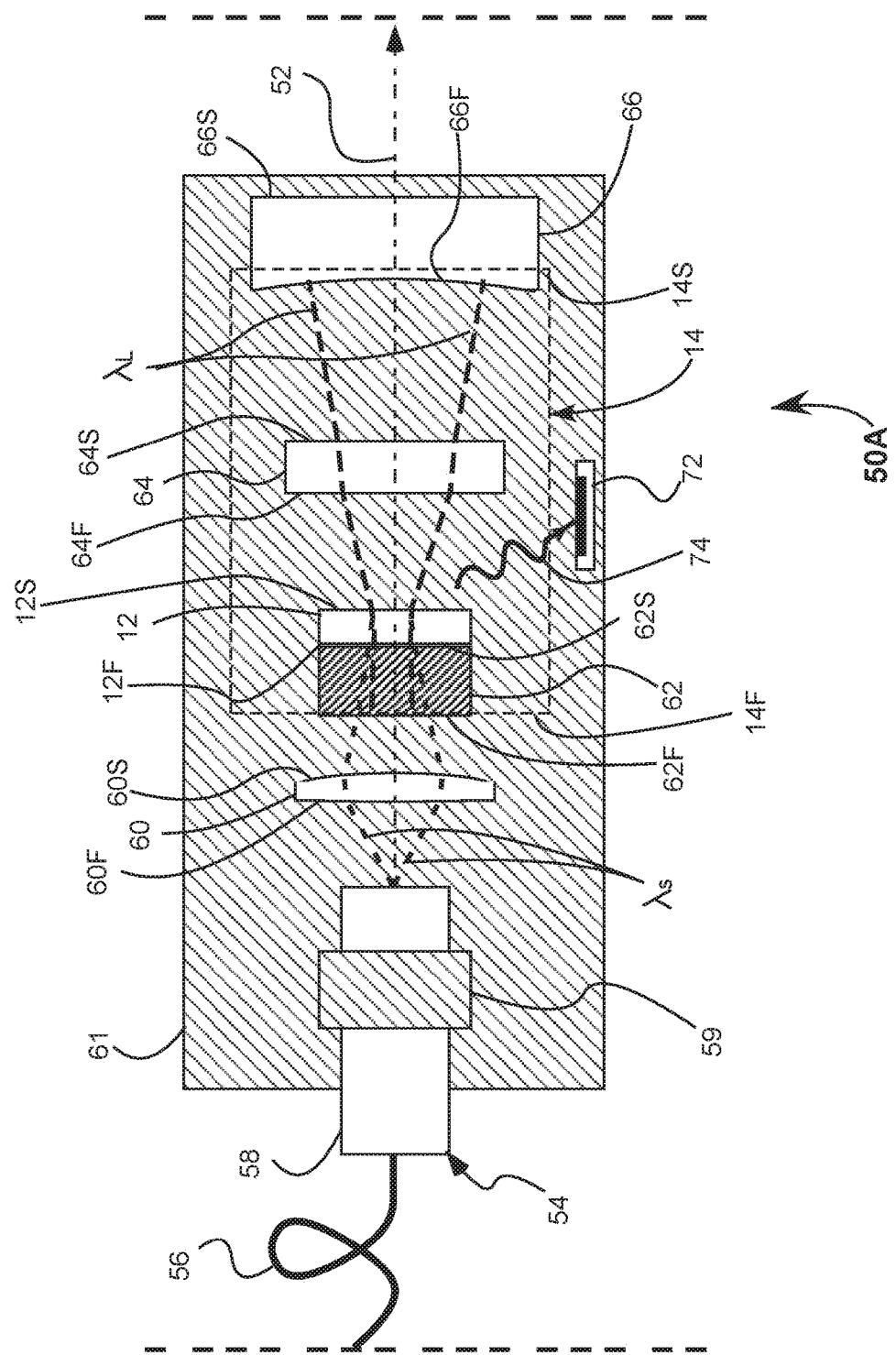
FIG. 2A is a plan view of an embodiment of the laser system with an end-pumped design.

Referring to FIG. 2A, one embodiment of the present invention, a laser system 50A has RE:XAB gain medium 12. RE:XAB gain medium 12 has a first surface 12F and a second surface 12S. Gain medium 12 resides within resonator cavity 14. Resonator cavity 14 is defined by a first surface 14F and a second 14S, the resonator cavity surfaces also being surfaces of components along an optical axis 54.

Here, the pumping source is a fiber coupled laser diode 54. Fiber coupled laser diode (LD) 54 has output directed towards RE:XAB gain medium 12. In this embodiment, laser system 50A has an end-pump passive q-switch design with fiber coupled LD 54 emitting optical radiation $\lambda_s$ along optical-axis 52 towards gain medium 12. Optical radiation $\lambda s$ is in the absorption band of RE:XAB gain medium 12. Fiber coupled laser diode 54 has an optical fiber 56 terminating in a cylindrical ferrule 58. Ferrule 58 is mechanically fastened in 3-point contact mount 59, 3-point mount 59 integrated within, or mechanically fastened to, a baseplate 61. Optical fiber 56 terminates at the laser diode package, the laser controller operating the fiber coupled laser diode via a driver, the laser controller and the pump driver not shown in the present view.

Fiber coupled LD source 54 can comprise of one emission source or a plurality of emission sources. For instance, the pump source can be a single LED or semiconductor laser diode element, or a plurality of LED or semiconductor laser diode elements. The laser diode sources can be coupled into a single optical fiber or a plurality of optical fibers all of which are directed towards the RE:XAB gain medium. The optical fibers can be singlemode, polarization maintaining, or multimode. The optical fiber can include features such as mode mixing structures, bragg gratings, endcapping, coating, angled surface termination other such features.

Short wavelength optical radiation $\lambda_s$, represented as short dashed marginal rays, exit ferrule 58 according to the numerical aperture of optical fiber 56, or by the numerical aperture as modified by optional end-capping termination, towards the pump delivery optics. Here the pump delivery optics is an aspheric optic 60. Aspheric optic 60 has a first surface 60F and a second surface 60S. Optical radiation $\lambda_s$ refracts at aspheric optic surface 60F, propagates through the aspheric lens and refracts at second surface 60S, converging towards heat spreader 18 and gain medium 12.

Here, the heat spreader is an optically transparent window 62. Optically transparent window 62 has a first surface 62F and a second surface 62S. Here, heat spreader second surface 18S is in physical contact with gain medium first surface 12F, thereby in thermal communication. Optical radiation $\lambda_s$ enters heat spreader 62 refracting at window first surface 62F. Optically transparent window 62 is a transparent window with low absorption of optical radiation $\lambda_s$. For sufficient thermal contact with the RE:XAB gain medium, the optically transparent window may be bonded in conformal contact either with adhesives or by non-adhesive contact techniques such as optical contact or diffusion bonded. The optically transparent window is connected to baseplate 61, the baseplate acting as a heat sink for the heat spreader and a mounting structure for other optical components. In this configuration heat spreader 62 is within resonator 14 wherein window first surface 62F and first resonator surface 14F are the same surface. Window first surface 62F is coated with a short wavelength anti-reflective (AR-coating) coating and a long wavelength high-reflectance coating (HR-coating), thereby allowing the pumping emission into the gain medium while confining stimulated emission from the gain medium within the resonator. When the heat spreader is in optical or diffusion contact with the gain medium and the heat spreader is made from gain medium index-matching material, for instance undoped XAB, the short wavelength optical radiation enters the gain medium with substantially no loss from reflectance. Various embodiments and configurations of the heat spreader are discussed in detail further hereinbelow The short wavelength optical radiation enters the RE:XAB gain medium and the gain medium absorbs the short wavelength radiation. The absorption of the short wavelength optical radiation is dependent on the wavelength, pump polarization, crystallographic cut, stoichiometry, and orientation, the length and the illuminated cross-section of the RE:XAB gain medium. RE:XAB gain medium second surface 12S can optionally have a short wavelength HR-coating to reflect any unabsorbed short wavelength radiation.

The absorbed short wavelength radiation populates the upper energy states of the RE:XAB gain medium. Initially a broad spectrum of long wavelength radiation is emitted. Some of the long wavelength emission propagates to the q-switch, here the q-switch is a saturable absorber 64. Saturable absorber 64 has first surface 64F and second surface 64S. Saturable absorber 64 is a material that absorbs optical radiation up to a saturation point. Upon saturation the saturable absorber loses its ability to absorb, becoming suddenly transmissive. One suitable saturable absorber for NIR is Cobalt Spinel (Co:Spinel). Cobalt spinel absorbs from about 1100 nm to about 1600 nm. Alternatively, a saturable Bragg absorber or reflector could be used.

As the gain medium upper energy levels populate and emit a longer wavelength radiation $\lambda_L$, the saturable absorber saturates suddenly becoming a low loss medium and transmits long wavelength radiation $\lambda_L$. The long wavelength emission propagates to a output coupler 66. Output coupler 66 has a first surface 66F and a second surface 66S. Here, absorber first surface 66F is curved such that reflected radiation propagates back through the resonator such that the reflected long wavelength radiation beam size is about the same size as the short wavelength beam size illuminating the RE:XAB gain medium. First surface 66F has a partially reflective coating wherein the partially reflective coating reflects a discrete band of long wavelength radiation. The discrete wavelength band reflects back to RE:XAB gain medium 12 causing stimulated emission of populated energy states in the RE:XAB gain medium.

Lasing occurs when the RE:XAB medium is pumped sufficiently to cause population inversion, and losses become suddenly low due to saturation of the saturable absorber, and the roundtrip gain caused by simulated emission within the resonator exceed losses. The energy stored in the population inversion is emitted in a fast, intense laser pulse. The laser pulse transmits through output coupler second surface 36S. After pulse emission, and partial depletion of the RE:XAB energy states, the saturable absorber recovers to high-loss state and another pulse is eventually emitted, depending on continued or modulated pump current provided to the pumping source.

Here, the optional optical monitor provided is an avalanche photodiode (APD) 72. APD 72 detects a scattered light 74 from the intense laser pulse. APD 72 is placed at the periphery of the laser system such that the APD is not directly in the optical path of the laser system. Placing the APD at the periphery allows for detection of light scattered from optical elements during pulse emission. Using an APD allows detection of optical radiation at low levels. If scattered light is sufficient a PIN or other optical detector can be used. APD 72 may connect to the laser control and provide temporal feedback of the laser pulses. The optical monitor can provide temporal feedback of the pulse emission to the laser controller, which in turn can alter operation of the laser system based on the feedback.

Figure 2B:
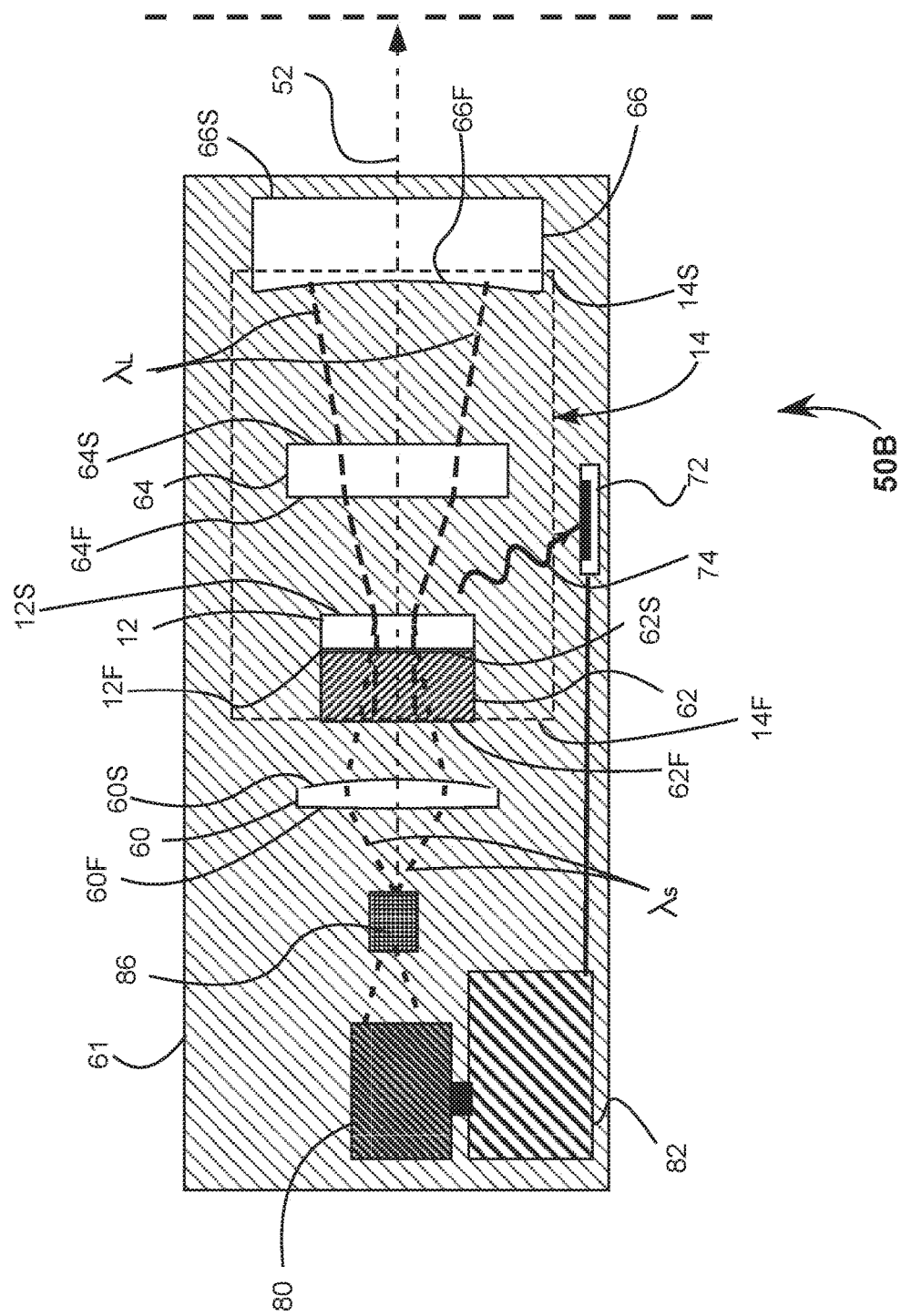
FIG. 2B is a plan view of an embodiment of the laser system wherein the pump source is a laser diode integrated on a baseplate.

FIG. 2B illustrates a laser system 50B. Laser system 50B is similar to that shown in FIG. 2A, except here the pumping source is an integrated laser diode 80. Laser diode 80 is directly mounted on baseplate 61. Pumping radiation $\lambda_S$ is emitted and coupled into the beam delivery optics. Here the beam delivery optics include an optional mode filtering optic 86 and aspheric lens 60. Mode filtering optic 86 may include optical fiber, anamorphic optic, or other such beam shaping optic to allow modification of transverse modes. Such mode filtering optics allow filtering of single-mode and multimode output pumping radiation in order to achieve the desired beam profile. For instance, if the pumping radiation emits an anamorphic beam, whether multimodal or single mode, the mode filtering optic can homogenize or strip the modes to provide a single or multimodal beam structure in order to provide even circular illumination onto gain medium 12. If the mode filtering optic includes a multimodal optical fiber, mode scrambling can be implemented by pinching optical fiber in various locations in order to provide a high order transverse mode homogenized illumination.

Here a laser controller 82 is shown integrated on baseplate 61. The laser controller providing pump current to laser diode 80. Laser controller 82 is also in electrical connection with photodetector 72, temporally monitoring lasers pulses.

Figure 2C:
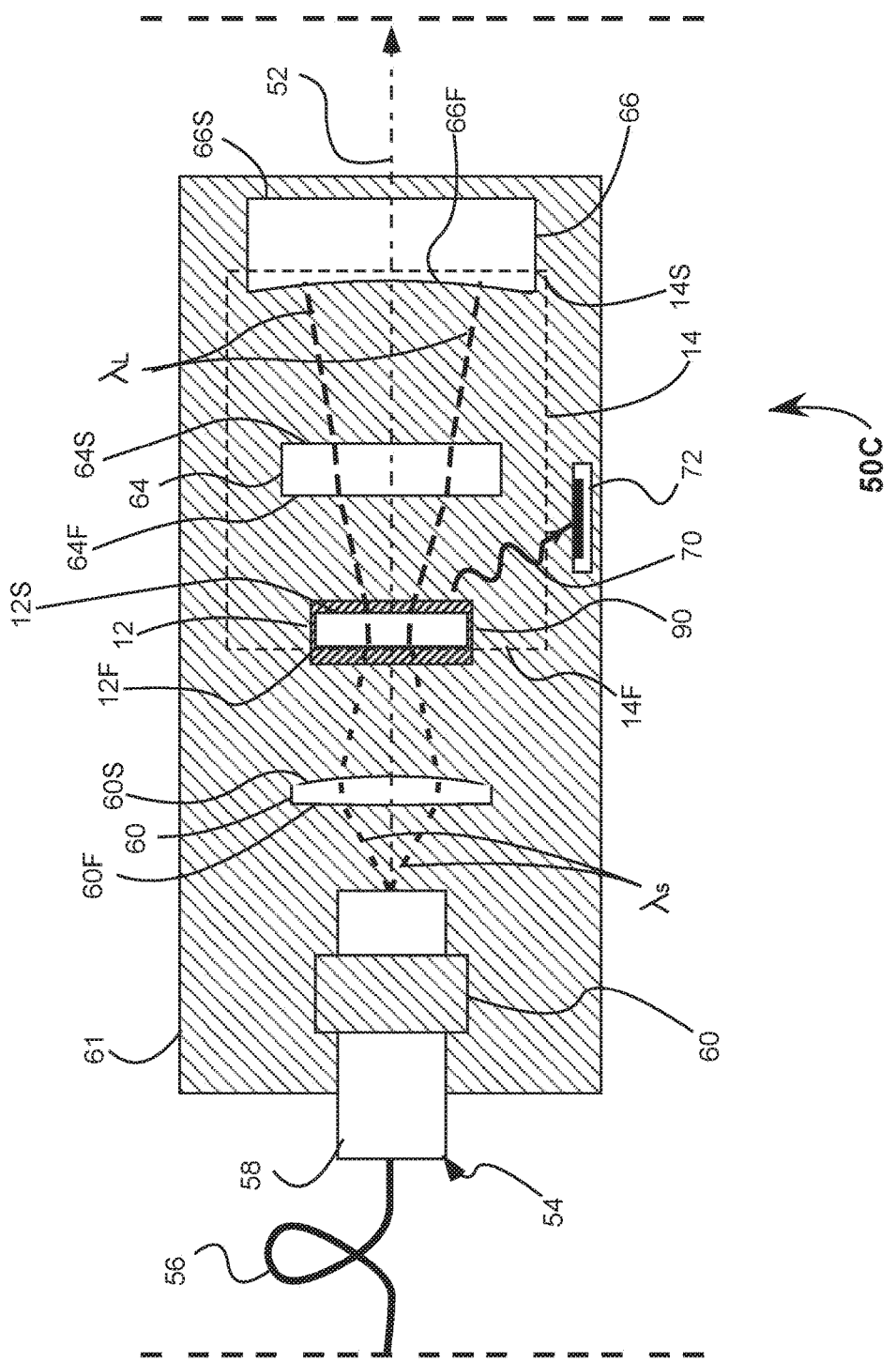
FIG. 2C is a plan view of an embodiment of the laser system wherein the heat spreader is not within the clear aperture of the RE:XAB gain medium.

FIG. 2C is a plan view of a laser system 50C, another embodiment of the present disclosure. Laser system 50C is similar to that shown in FIG. 2A, except here the heat spreader is a mechanical mount 90, the mechanical mount in thermal communication with the side and optionally the perimeter of gain medium 12, the mechanical mount not in contact with the clear aperture. The clear aperture being the portion of the gain medium surface through which pumping or lasing radiation is intended to propagate. The clear aperture can be centered, off-center, symmetric and asymmetric with respect to the RE:XAB gain medium. For instance the pump radiation can be directed to an outer edge of the RE:XAB gain medium, the outer-edge being closer to bulk thermal spreader material to allow faster thermal transport.

In laser system 50C, first resonator surface 14F is RE:XAB gain medium first surface 12F, first surface 12F having an AR coating for the short wavelength radiation and an HR coating for the long wavelength radiation. Alternatively, the heat spreader can be a thermally conductive epoxy, solder-based, or combinations thereof. The heat spreader can be thermally conductive epoxy, the thermally conductive epoxy acting as both the heat spreader and mounting adhesive bonding the gain medium to the baseplate. The gain medium can be metalized on surfaces outside the clear aperture and any edges, then solder mounted onto baseplate 61.

Figure 2D:
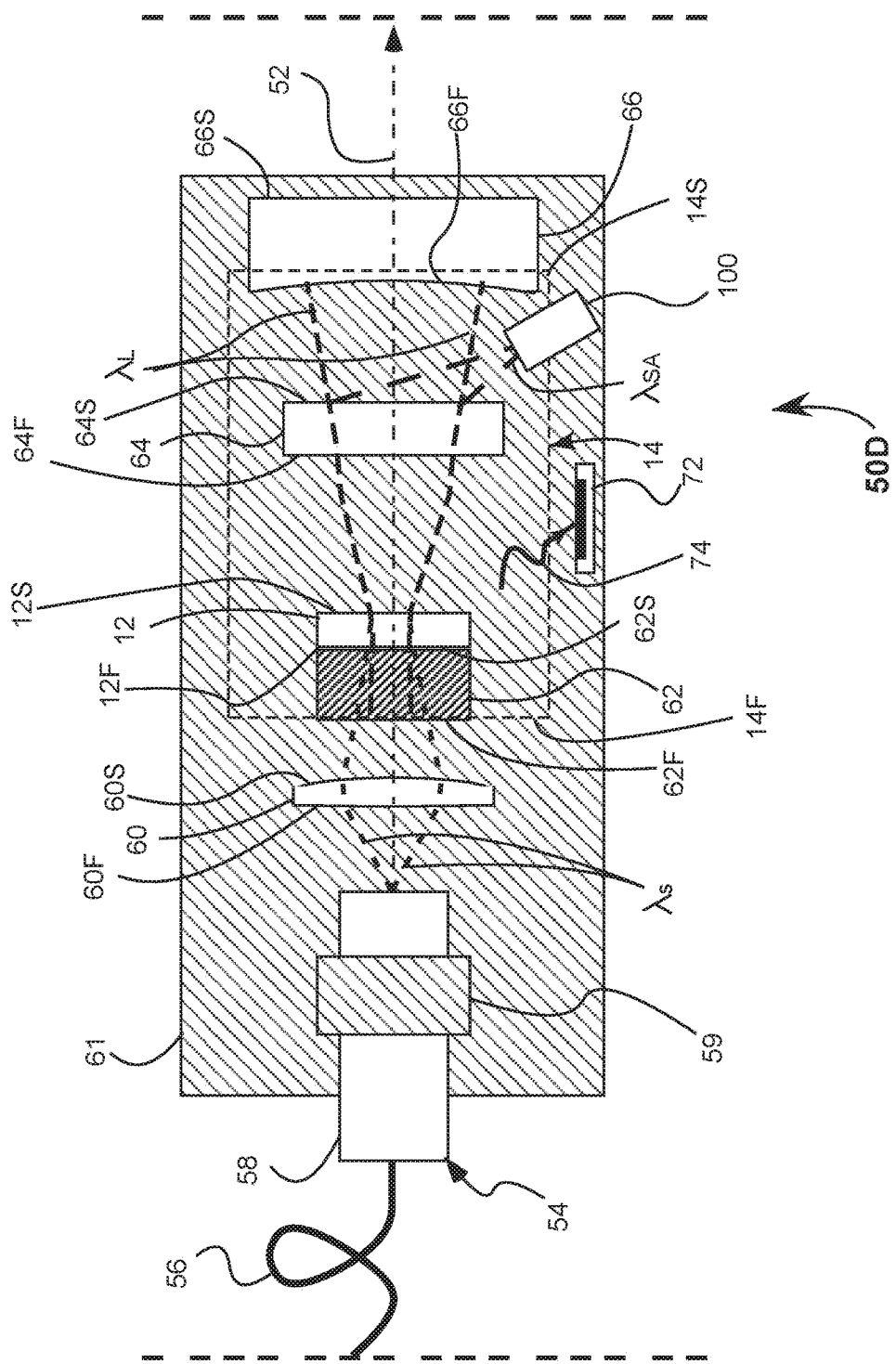
FIG. 2D is a plan view of the laser system wherein an off-axis active optical q-switching is employed.

FIG. 2D is a plan view of a laser system 50D, similar to that shown in FIG. 2A, except here saturable absorber 64 is additionally controlled with another radiation source. A saturable absorber optical driver 100 has an optical radiation $\lambda_{SA}$ directed towards saturable absorber 64. Saturable absorber optical driver 100 can be an LED, LD, laser or other such radiation source. The saturable absorber optical driver wavelength must be within the spectral absorption region of the saturable absorber 64.

The laser controller operates saturable absorber optical driver 100, allowing increased control of when saturable absorber 64 becomes transmissive. Optical radiation $\lambda_{SA}$ from the saturable absorber optical driver can be held constant or modulated. In constant current mode, intensity of optical output changes the frequency and pulse energy output from the laser system. Increased optical driver output radiation increases pulse emission frequency and lowers pulse energy. Modulating the saturable absorber optical driver, in coordination with driving the pump source allows increased deterministic control over saturation of the saturable absorber. Such a hybrid passive/active q-switching allows control over the pulse energy and temporal pulse emission.

Figure 2E:
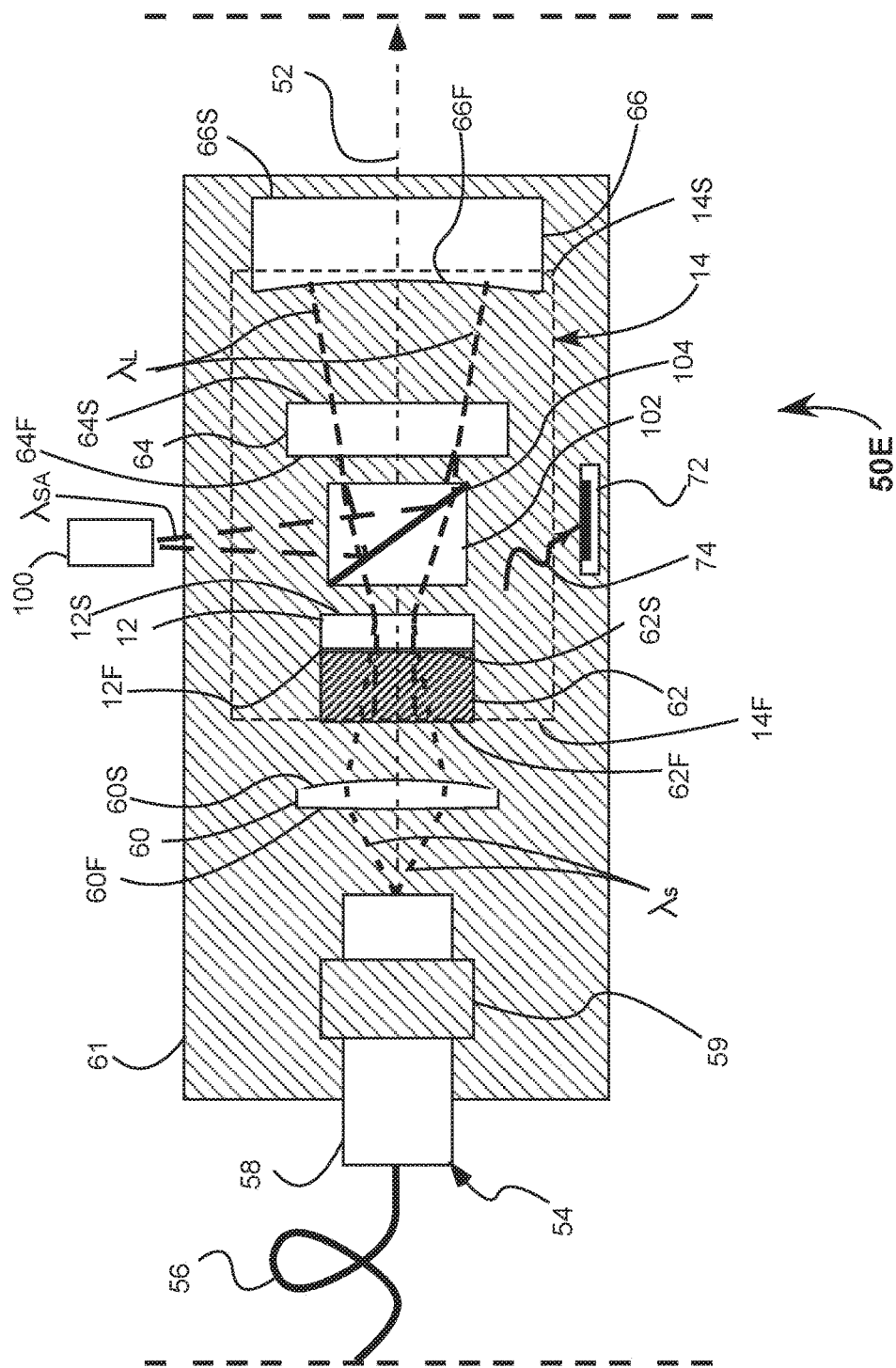
FIG. 2E is a plan view of the laser system wherein on-axis active optical q-switching is employed.

FIG. 2E is a plan view of a laser system 50E, similar to that shown in FIG. 2D, except here a spectral beam combiner 102 directs from saturable absorber optical driver 100 to saturable absorber 64. Spectral beam combiner 102 is between RE:XAB gain medium 12 and saturable absorber 64. Here the spectral beam combiner is a cube and has a spectral filter on the 45-degree interface 104, the spectral filter transmitting long NIR wavelength emission and reflecting saturable absorber driver emission $\lambda_{SA}$. Having an on-axis spectral beam combiner allows better matching of the cross-section of the saturable absorber that is illuminated.

Figure 2F:
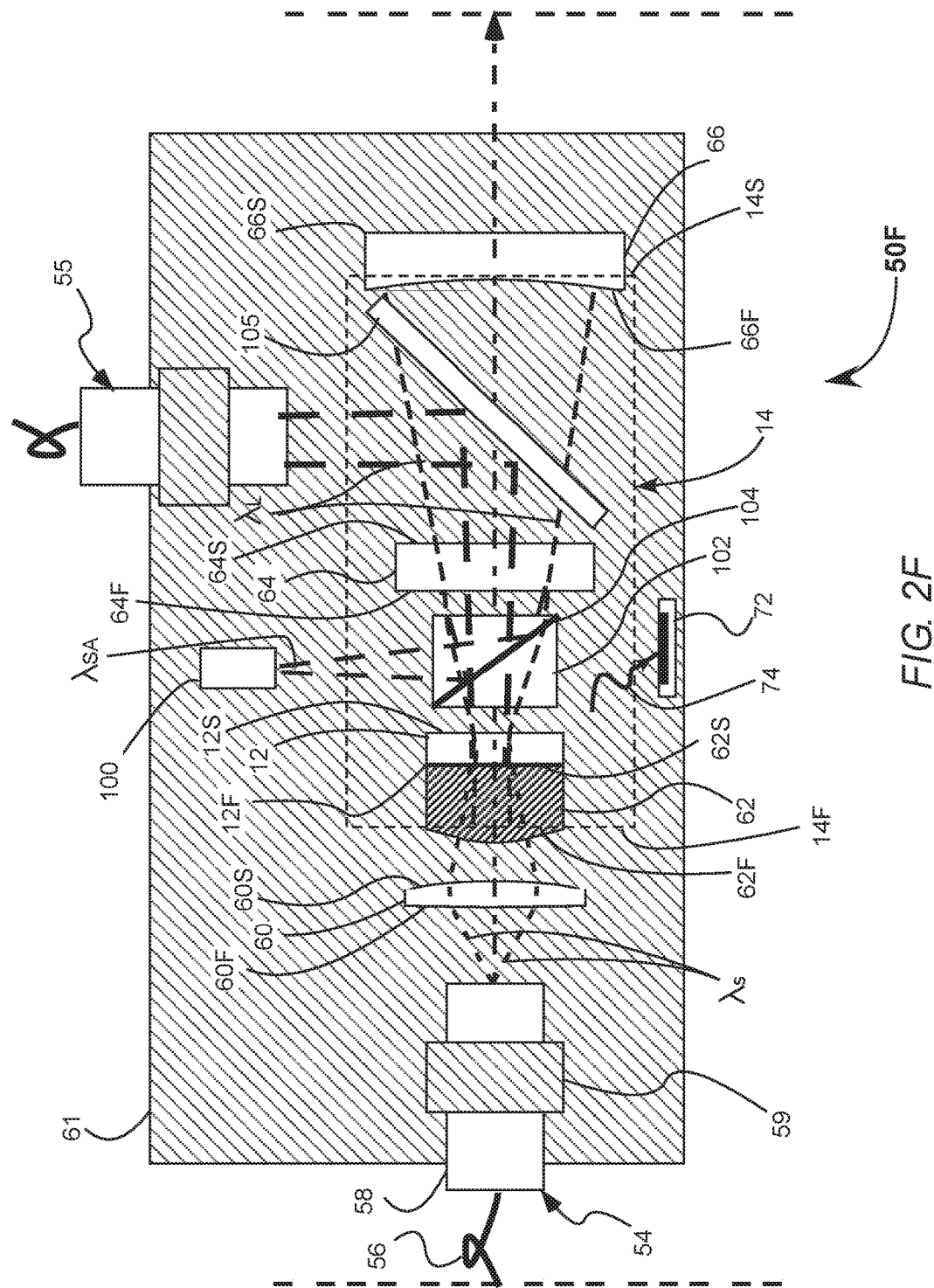
FIG. 2F is a plan view of a double end-pumped laser system.

FIG. 2F is a plan view of a double end-pumped laser system 50F, similar to that shown in FIG. 2C, except here the pumping source comprises another fiber coupled laser diode 55. Fiber coupled laser diode 55 has output directed towards RE:XAB gain medium 12 thereby providing a double end-pump configuration. In this embodiment, an coupler optic 105 is at a 45-degree angle with respect to the resonator cavity and directs optical radiation from pump source 55 to the RE:XAB gain medium and transmits laser emission.

FIG. 3A is a graph 110 showing the polarized absorption coefficient spectra of the RE:XAB laser system, wherein RE is Er,YB and X is Y from about 900 nm to about 1025 nm. A π-polarized absorption coefficient spectra 112 has a relatively flat response with a substantially flat response region 114 at about 940 nm. A σ-polarization absorption coefficient spectra 116 has absorption with spectral absorption peak 118 at about 976 nm with a full width half max (FWHM) 120 of about 17 nm. As aforementioned, the amount of optical pumping output absorbed depends on the pumping wavelength, pumping polarization, and thickness of the gain medium. When pumped with σ-polarization at about 976 nm the thickness for the c-cut Er,Yb:YAB gain medium can be from about 100 to about 200 microns (μm) due to the large absorption coefficient of about 184 cm$^{-1}$. To ensure pumping at about 976 nm with a laser diode based pumping mechanism, the pump can be wavelength stabilized by either integrating a distributed Bragg reflector or by controlling the temperature of the device. When pumped with the π-polarized state, the thickness of the Er,Yb:YAB crystal has to be thicker relative to the σ-polarization thickness to achieve similar absorption, but the pumping wavelength and variations thereof during operation have less effect, especially when pumped in flat response region 114 at about 940 nm.

FIG. 3B and FIG. 3C show the Er,Yb:YAB gain medium emission spectra from about 1450 nm to about 1500 nm for a specific average pump power. FIG. 3A is graph 110B showing π-polarization emission spectra 122. Emission spectra 122 has multiple emission peaks. FIG. 3C is a graph 110C showing σ-polarization emission spectra 124. Emission spectra 124 has multiple emission peaks with a strong peak 126 at about 1530 nm. As aforementioned partially reflecting coating design on the first surface of the output coupler can be tuned to provide spectral emission at any of the emission wavelengths, the efficiency of the laser increasing when the partially reflecting coating is designed for emission peaks, for example 1530 nm, and the efficiency also increasing when the Er,Yb:YAB crystal orientation is oriented to preferred polarization angles.

The Er,Yb:YAB gain medium absorbs radiation in substantially similar bands as shown in FIG. 3A and FIG. 3B and the pumping source can provide pumping radiation at those wavelengths. For example, the pumping source can be a 1470 nm laser diode, with the output coupler having a partially reflective coating at a wavelength longer than 1470 nm. Implementing such a pumping source with pumping radiation in about proximity to the lasing emission wavelength reduces the amount of heat produced relative to pumping at shorter wavelengths.

The heat spreader allows heat transfer from the gain medium when the laser system is operated at high power. When excited states release energy in nonradiative decay the energy is released as phonons. When operating at high powers, for instance above about 1 watt (W) average power with 100% duty cycle, heat buildup on the gain medium can cause thermal lensing effects and possibly cause damage to the crystal. Thermal lensing effects can lead to an instable resonator, limiting performance and power. In general the heat spreader and any heat sink in thermal communication with the RE:XAB must be able to handle the heat generated in the crystal by the pump source. Heat generation depends on the pump wavelength and the laser emission wavelength. Pump power to heat conversion can be from about 1% to about 45% of pump power. The heat spreader embodiments described below allow high average power operation.

Figure 4A:
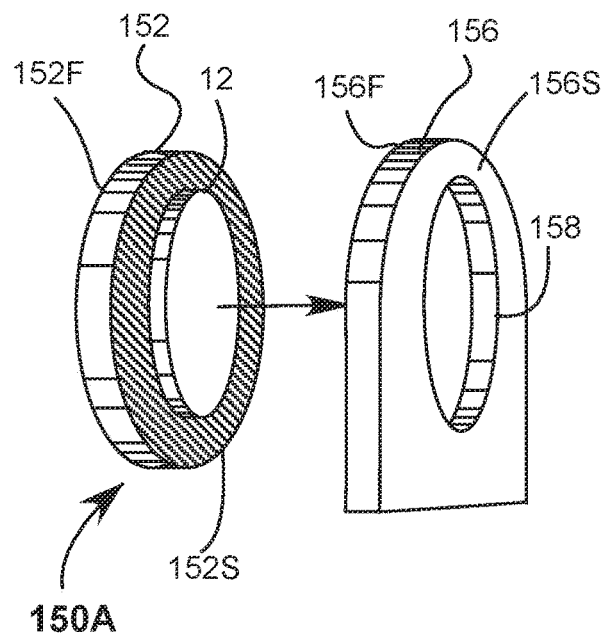
FIG. 4A is an exploded perspective view of one embodiment of the heat spreader wherein the RE:XAB crystal is in thermal communication with an optically transparent window and a thermally conductive mount.

FIG. 4A shows embodiment of a heat spreader 150. RE:XAB gain medium 12 is attached to a optically transparent window 152. Optically transparent window 152 has a first surface 152F and a second surface 152S. Optically transparent window 152 can be made from undoped XAB crystal or other optically transparent materials for either the pump source or emission source. Preferred material for the optically transparent window based on refractive index matching, coefficient of thermal expansion (CTE) matching, and thermal conductivity. The first surface of gain medium 12 is in thermal communication with optically transparent window 152 in either conformal, optical contact, or diffusion bonded.

In this example, optical window 152 has a diameter larger than the diameter of gain medium 12. The surface area exposed allows thermal contact to conductive mount 156. Conductive mount 156 has first surface 156F and second surface 156S with thru-hole 158. The diameter of thru-hole 158 is at least as large as the diameter of gain medium 12. Optically transparent window 152S is attached to conductive mount first surface 156F such that they are in thermal communication. Conductive mount 156 can be made from thermally conductive material such as metals, ceramics, and composite materials. Nonlimiting examples of such material include copper, aluminum, aluminum nitride, and graphite/graphene/metal embedded polymers.

The method of attaching or fastening the optically transparent window to the conductive mount can be mechanical or adhesive based, depending on the materials used and expected operation power. For instance, when the conductive mount and the transparent window have dissimilar CTE, clamp-based mechanical fastening, and holding two conformal surface in contact can be implemented. Thermal pastes or flexible metals such as indium can be applied to increase thermal communication. Likewise, adhesives with flexibility can be implemented. When adhesives are implemented they are preferably thin or otherwise thermally conductive to allow appropriate heat transfer. For instance, thermally conductive epoxies, films and tapes can be implemented.

The thermally conductive mount is attached to either the baseplate or other rigid mounting structure which can include passive or active cooling. The baseplate can be either mounted to another conductive heat sink for high power operation, or with sufficient surface area to allow environmental heat transfer. In one embodiment a water channel can be implemented within the perimeter of conductive mount 76. Channels can be designed for laminar or turbulent flow. Alternatively, a thermoelectric cooler (TEC) can be implemented either in connection to the baseplate or in direct contact with the conductive mount. Addition of thermistors provide temperature feedback and allow controlled operation of active cooling techniques, by for example, the laser controller.

Heat spreader embodiment 152 shows one preferred orientation wherein pumping radiation enters gain medium 12 from the first surface. Alternatively, the orientation can be reversed. Further, conductive mount 152 can be placed such that conductive mount second surface 156S is in thermal communication with optically transparent window first surface 152F. When oriented in such a manner thru-hole 158 can be sized smaller than the diameter of gain medium 12, still sufficiently large to allow the pump radiation to pass unobstructed.

Figure 4B:
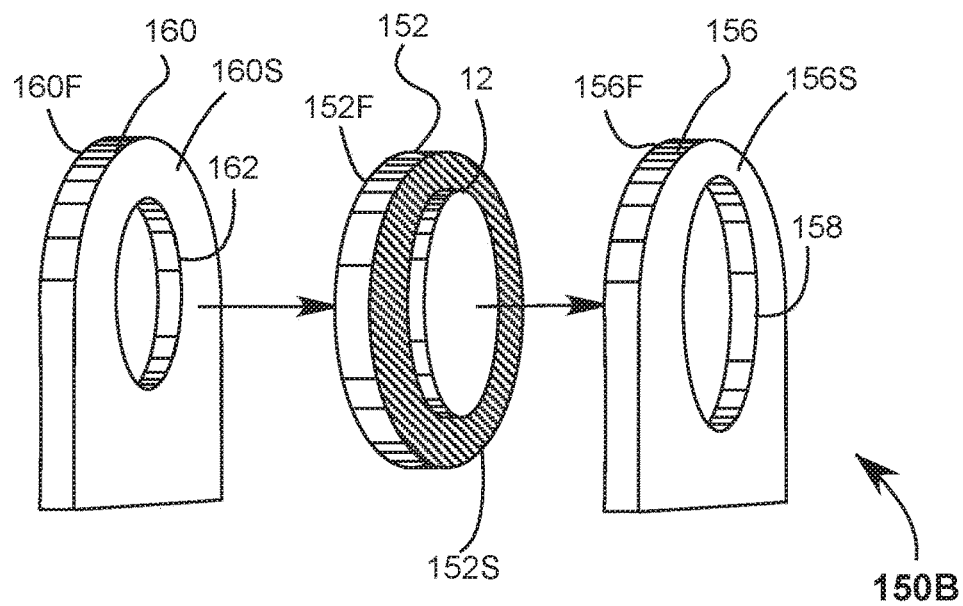
FIG. 4B is an exploded perspective view of another embodiment of the heat spreader wherein the RE:XAB similar to that shown in FIG. 4A, further comprising another thermally conductive mount in thermal communication with the gain medium.

FIG. 4B shows a heat spreader embodiment 150B. Heat spreader 150B is similar to the heat spread as that shown in FIG. 4 with the addition of thermally conductive mount 160. Thermally conductive mount 160 has a first surface 160F, a second surface 160S, and a thru-hole 162. Second surface 160S is in thermal communication with optically transparent window 152F. Here, thru-hole 162 can be sized smaller than the diameter of gain medium 12, still sufficiently large to allow the pump radiation to enter through the thru-hole.

Figure 4C:
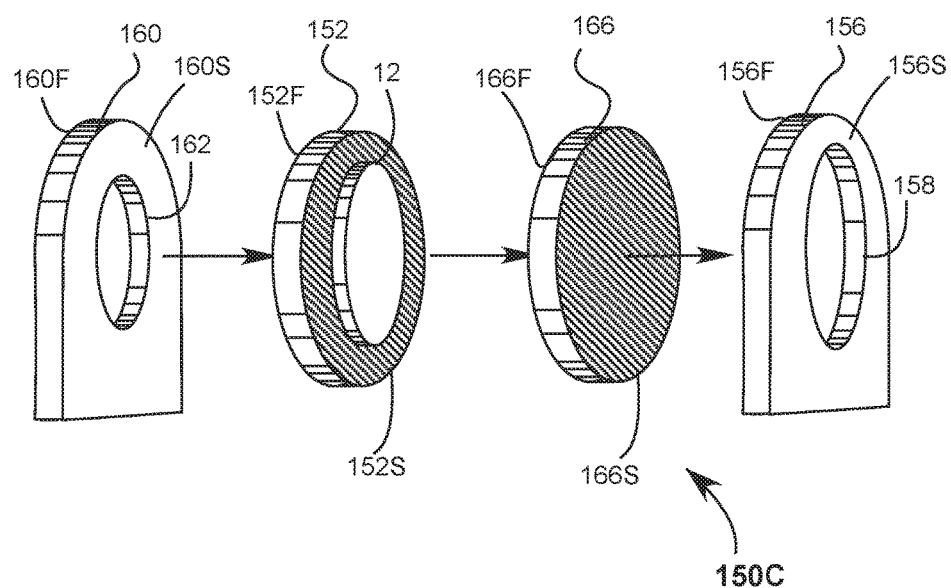
FIG. 4C is an exploded perspective view of another embodiment of the heat spreader wherein the gain medium is sandwiched between two optically transparent windows and thermally conductive mounts.

FIG. 4C shows a heat spreader embodiment 150C. Heat spreader 150C is similar to that shown in FIG. 4B with the addition of an optically transparent window 166. Transparent window 166 has a first surface 166F and a second surface 166S. The second surface of gain medium 12 in thermal communication with transparent window first surface 166F. Transparent window second surface 166S is in thermal communication with conductive mount first surface 156F. Here, thru-hole 158 can be sized smaller than the diameter of gain medium 12, sized sufficiently large to allow lasing radiation to pass unobstructed.

Figure 4D:
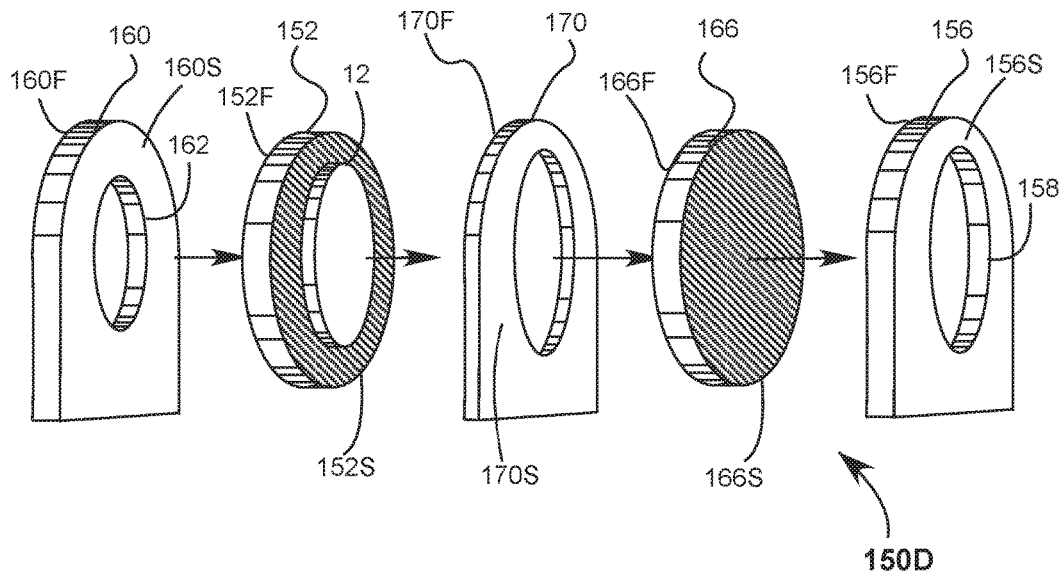
FIG. 4D is an exploded perspective view of one yet another embodiment of the heat spreader, similar to that shown in FIG. 4C, wherein an additional thermally conductive mount is between the two optically transparent windows.

FIG. 4D shows yet another heat spreader embodiment. A heat spreader 150D has that shown in FIG. 4C with the addition of a thermally conductive mount 170. Thermally conductive mount 170 has a first surface 170F and a second surface 170S. Here thermally conductive mount 170 is the same thickness or thinner than gain medium 12. Second surface 152S of optically transparent window 152 is in thermal communication with conductive mount first surface 170S. When thermally conductive mount 170 is the same thickness as gain medium 12, then second surface 170S is also in thermal communication with optically transparent window first surface 166F.

Figure 4E:
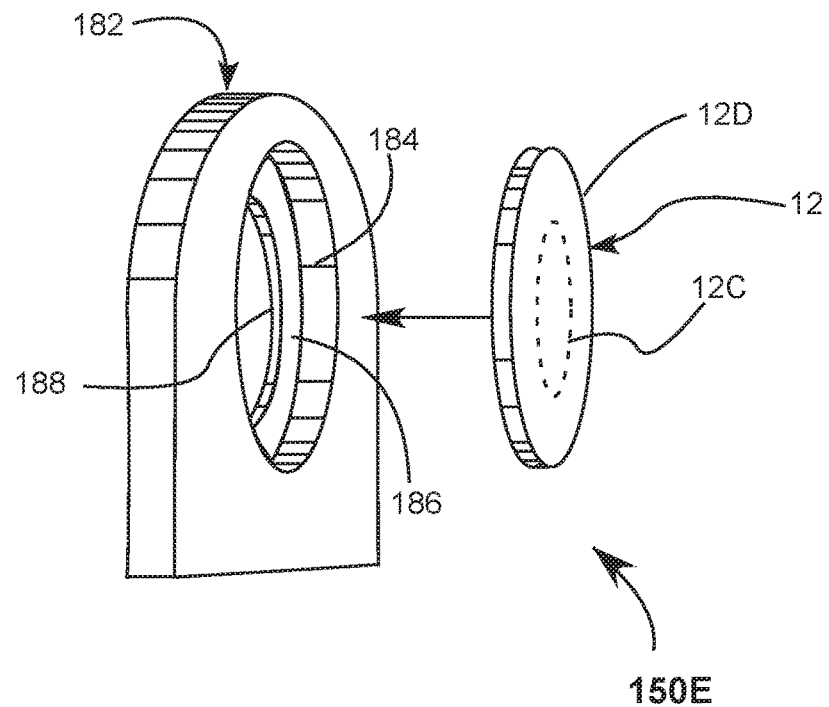
FIG. 4E is an exploded perspective view of the heat spreader wherein the heat spreader is not in contact with the clear aperture of the gain medium.

FIG. 4E shows a heat spreader embodiment 150E, wherein the heat spreader is not in contact with the gain medium clear aperture. Here a conductive mount 182 has a open diameter 184, the diameter at least as large as gain medium diameter 12D. Gain medium 12 resides within heat spreader 182, fitting within diameter 184. Gain medium 12 is in thermal communication with conductive mount 182 by physical contact with retainer lip 186. Retainer lip 186 has an inner diameter 188 at least as large as the gain medium clear aperture 12C. The gain medium can be secured by mechanically, for instance with a retaining ring or with an adhesive. The thermal communication can be increased with addition of thermal past, thermal epoxy, solder, wettable metal such as an indium, or other such filler.

Figure 4F:
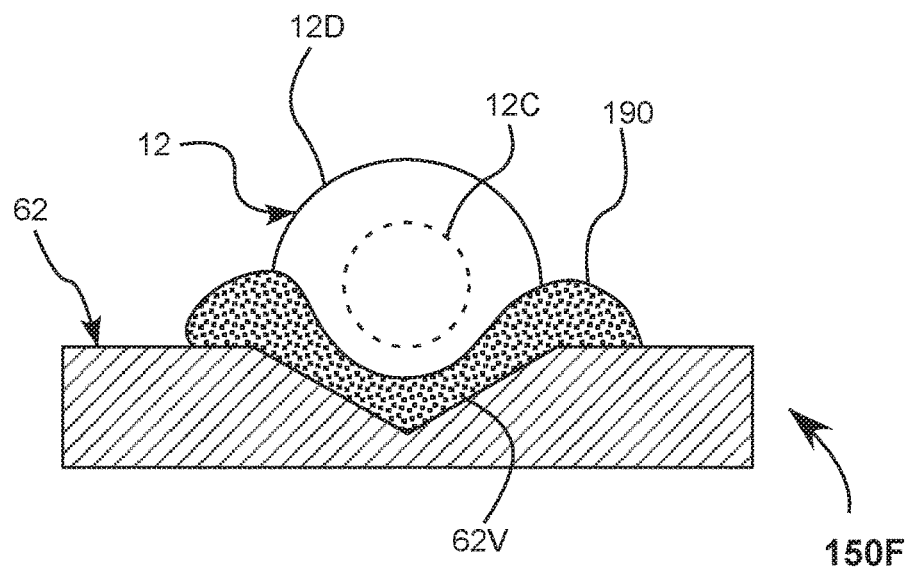
FIG. 4F is cross-section view of another of the heat spreader, wherein the heat spreader is not in contact with the clear aperture of the gain medium.

FIG. 4F shows a heat spreader embodiment 150F, another of the heat spreader embodiments where the heat spreader is not in contact with the gain medium clear aperture. Here, heat spreader 190 is a thermally conductive material, deposited when viscous, then cured. Two nonlimiting examples include thermally conductive epoxy and solder. In this embodiment the gain medium resides with a V-groove 62V, the V-groove machined within baseplate 62. The thermal epoxy is deposited and in thermal contact with the base of gain medium 12, not in contact with clear aperture 12C. If increased thermal management of the gain medium is required heat spreader 190 can be deposited to encompass the entire gain medium, not deposited within the clear aperture.

Figure 5A:
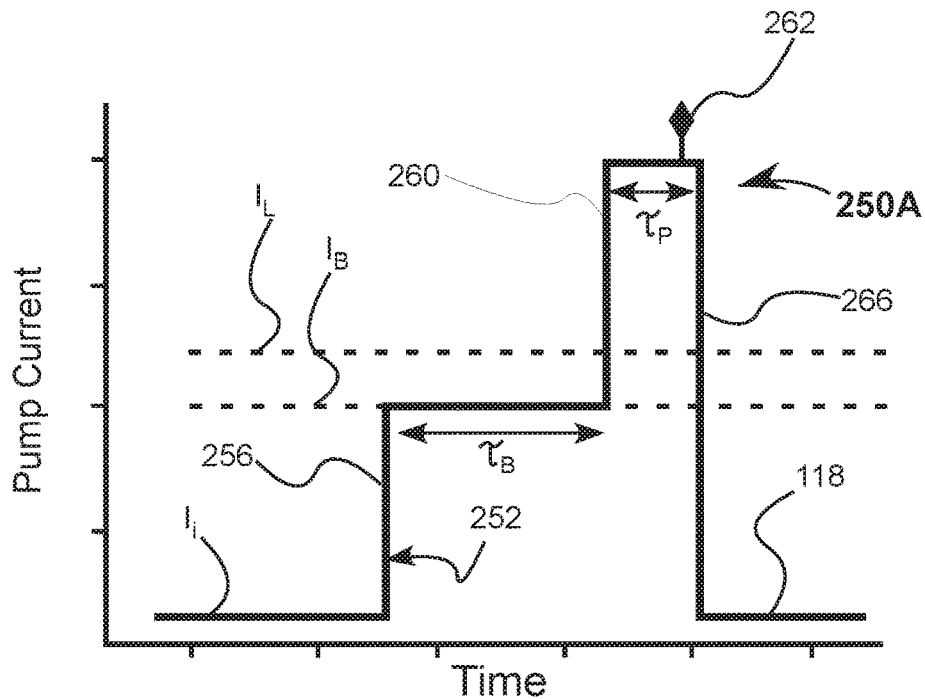
FIG. 5A is a graph of a bias pump method operating the laser system.
Figure 5B:
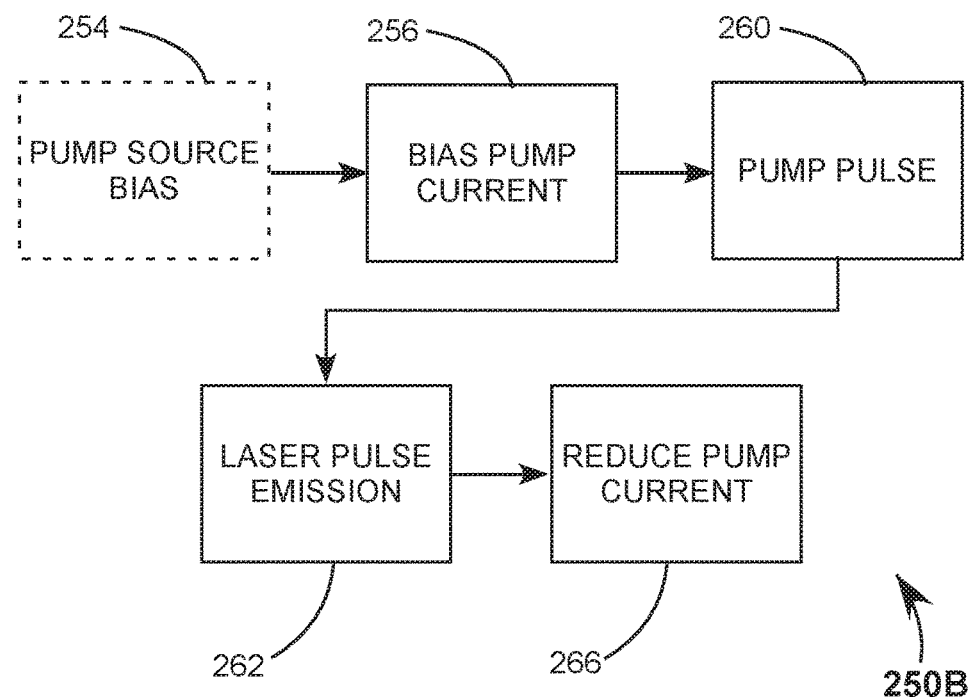
FIG. 5B is a block diagram of the bias pump method steps illustrated in FIG. 5A

FIG. 5A and FIG. 5B illustrates a bias method of operating the laser system of the present disclosure to reduce pulse to pulse jitter. In general, pulsed laser performance metrics include average power, peak pulse power, pulse energy, pulse duration, and pulse frequency. The average power is the product of pulse energy and repetition rate. Peak pulse power is the product of the pulse duration and pulse energy, both of which depend on the detailed pulse shape. Pulse frequency depends on the pumping mechanism, modulation, and q-switch device employed. For passive q-switching, high frequency pulse rates can be increasing pump intensity, but pulse-to-pulse jitter or timing jitter occurs due to instability of q-switching. Instable q-switching arises from a variety of factors which include residual population inversion in the gain medium, recovery of the saturable absorber, thermal effects of the RE:XAB gain medium, and pump source fluctuation.

Timing jitter is inversely proportional to the slope the population inversion density as it is pumped to a lasing state, or within a lasing window. Increasing the population density slope, decreases pulse-to-pulse jitter. One method of increasing the slope is through control of the pumping source and pump profile.

FIG. 5A is of a graph 250A, depicting a current pump profile 250A. FIG. 5B is a block diagram 250B, depicting the bias method steps as illustrated in FIG. 5A. During operation the pump source receives pump current from the pump driver, the pump driver controlled by the laser controller. The pump current determines the amount of short wavelength NIR optical radiation emitted by the pump source. The pump current has a pump current profile 252. Pump current profile 252 is held at an initial current L such that little or no optical radiation is not emitted from the pump source. A LD for example emits little to no optical radiation when operated at or below the laser threshold level. Current Ii can be at zero or any intermediate value about below the emission threshold of the pump source, thereby providing a pump source bias 254.

When a pulse is desired, the laser controller causes a current increase 256 to a bias pump current $I_B$. Bias pump current $I_B$ causes increased population density within the RE:XAB gain medium, but is below a lasing threshold current $I_L$, lasing threshold current sufficient to cause pulse emission if applied continuously. Bias pump current IB is applied for a bias duration $\tau_B$. Bias duration $\tau_B$ is long enough to cause increased population inversion density at about a predictable level.

A pump pulse 260 is delivered via a sudden increase in the current, pump pulse greater than a lasing threshold current $I_L$. The pump pulse causes a sudden increase in population inversion density, resulting in a laser pulse emission 262. The sudden increase causes population inversion density slope to be high, shortening the temporal lasing window.

The pump current is reduced at point 266 after the emission of the laser pulse, down to after pulse current $I_{AP}$. After pulse current $I_{AP}$ can be at about any value between the zero and the bias current, depending on when the next desired pulse is desired and the residual population inversion density. With the about predictable population inversion level and steep population inversion slope, the lasing window is shortened and pulse emission about temporally predictable lowering pulse to pulse jitter in continued operation.

The bias-method of operating the laser system can be implemented in a variety of ways. For instance, when continuous operation of the laser system is desired with identically temporally spaced laser pulses, the same pump current profile can be implemented. Alternatively, a plurality of pump profiles can be used to cause varying delays between pulses. The pump profiles can be altered by the pump source bias applied, the bias pump current, or the pump pulse and durations of each. In one embodiment the pump profile can comprise two pump sources with two different wavelengths, for example 940 nm and 976 nm. Pump current profile 250A is shown as a step-function, in practice the pump current can be driven as shown, as a non-linear continuous function, or as a series of pulses of varying amplitude and pulse width.

The pump profile can be constructed from one modulated source or a plurality of pump sources. For instance, one pump source can provide the bias pump current and the pump pulse by modulation of the current of the one pump source. Alternatively, a plurality of pump sources can be implemented with one pump source providing the bias pump current and a second pump source providing the pump pulse. Further a combination a plurality of bias pump current sources and a plurality of pump pulse sources can be provided.

The present embodiments and methods described in the present disclosure invention have a variety of useful applications. In particular, the lasing emission bands in some embodiments are in about the so-called "eye-safe" region and can be utilized in applications in areas in which intense laser pulses are normally not permitted. Applications include machine vision in manufacturing processes, robotics machine vision including autonomous car guidance, range finding, LIDAR/LADAR applications, biomedical application, target designation, and other such applications.

From the description of the present disclosure provided herein one skilled in the art can manufacture apparatus and practice the methods disclosed in accordance with the present invention. While the present invention has been described in terms of particular embodiments and examples, others can be implemented without departing from the scope of the present invention. In summary, the present disclosure above describes particular embodiments. The invention, however, is not limited to the embodiments described and depicted herein. Rather, the invention is limited only by the claims appended hereto.

What is claimed is:

1. A method of bonding a heat spreader to a laser gain medium comprising:
    providing a RE:XAB gain medium within a resonator cavity, where X is selected from Y, Ca, Lu, Yb, Nd, Sm, Eu, Gd, Ga, Tb, Dy, Ho, Er, and where RE is selected from Lu, Y, Yb, Nd, Sm, Eu, Gd, Tb, Dy, Ho, Er, Pr, Tm, Cr, Ho, providing a heat spreader, and providing a bonding solution;

applying a volume of the bonding solution onto either a surface of the RE:XAB or a surface of the heat spreader, aligning the RE:XAB and the heat spreader, applying pressure to draw the surfaces of the RE:XAB gain medium and the heat spreader together thereby uniformly spreading the bonding solution; and curing the bonding solution.

2. The method of claim 1, wherein the bonding solution is a mixture of nano-pure water and sodium silicate [(NaOH)x(Na2SiO3)y.SiO2].

3. The method of claim 2 wherein the concentration of sodium silicate is Na2O at 21.2% and SiO2 at 53% with PH>=11.

4. The method of claim 2 wherein the volumetric ratio of nano-pure water and sodium silicate is 1:1.

5. The method of claim 1, further including cleaning the surface of the RE:XAB gain medium and the surface of the heat spreader with a cerium oxide paste and nano-pure water.

6. The method of claim 5, further including immersing the surfaces of the RE:XAB gain medium and the surface of the heat spreader in sodium bicarbonate solution, or cleaning the same with an optical grade tissue immersed in sodium bicarbonate paste, then rinsing with nano-pure water.

7. The method of claim 1, wherein the bonding solution is sonicated prior to use.

8. The method of claim 6, wherein the bonding solution is used within 5 minutes of sonication.

9. The method of claim 6, wherein the sonication at 40 kHz, at 70 W.

10. The method of claim 6, wherein the bonding solution is sonicated for at least 5 minutes.

11. The method of claim 1, wherein curing the bonding solution includes ambient temperature cure.

12. The method of claim 1, wherein the RE:XAB gain medium is Er,Yb:YAB.

13. The method of claim 1, wherein the heat spreader is sapphire.

14. The method of claim 1, wherein the heat spreader is selected from YAB, diamond, synthetic diamond, or ceramic materials.

15. The method of claim 1, wherein the surface of the heat spreader and the surface of the RE:XAB gain medium are flat.

16. The method of claim 1, wherein the surface irregularity of the surface of the RE:XAB is less than or equal to $\lambda/10$ peak-to-valley.

* * * * *